United States Patent [19]

Ahn

[11] Patent Number: 5,077,689
[45] Date of Patent: Dec. 31, 1991

[54] METHOD FOR MULTI-BIT PARALLEL TEST IN SEMICONDUCTOR MEMORY DEVICE

[75] Inventor: Gye-Ho Ahn, Seoul, Rep. of Korea

[73] Assignee: SamSung Electronics Co., Ltd., Kyung Ki, Rep. of Korea

[21] Appl. No.: 559,697

[22] Filed: Jul. 30, 1990

[30] Foreign Application Priority Data

Jan. 18, 1990 [KR] Rep. of Korea ............... 1990-8924

[51] Int. Cl.$^5$ ............................................. G11C 13/00
[52] U.S. Cl. ............................... 365/201; 365/189.01
[58] Field of Search ............. 365/201, 189.01, 230.01, 365/207

[56] References Cited

U.S. PATENT DOCUMENTS 4,977,542 12/1990 Matsuda et al. ................... 365/207

*Primary Examiner*—Terrell W. Fears
*Attorney, Agent, or Firm*—Robert E. Bushnell

[57] ABSTRACT

A method for performing a multi-bit parallel test in a semiconductor memory device having a data output buffer and a given number of data bus pairs and memory cell groups. The semiconductor memory device further includes a data sensing circuit for sensing each pair of data supplied from the memory cell groups; a driver coupled between the data sensing circuit and the given number of data bus pairs; first comparators coupled between the data sensing circuit and a corresponding one of the data bus pairs; a second comparator having inputs coupled to the data bus pairs and an output connectable to the data output buffer; and a data selection circuit having inputs coupled to the data bus pairs and an output coupled to the data output buffer. The data sensing circuit delivers to the data bus pairs a plurality of data pairs from the memory cell group, through the driver upon a normal mode, whereas the data sensing circuit delivers the plurality of data pairs to the first comparator upon a second mode.

20 Claims, 4 Drawing Sheets

METHOD FOR MULTI-BIT PARALLEL TEST IN SEMICONDUCTOR MEMORY DEVICE

BACKGROUND OF THE INVENTION

The present invention relates to a method for testing a semiconductor memory device, and in particular, a method for performing a multi-bit parallel test with a comparatively small area, without affecting a normal operation of the semiconductor memory device.

High-integration of semiconductor memory devices generally tends to increase their production cost due to increase of their chip area. In particular, the higher the integration in semiconductor memory devices becomes, the more time and cost for testing the same is required.

Therefore, a known method has been recently used to save the time and cost of testing, in which instead of serial data access, multiple bits are simultaneously tested in parallel. FIG. 1 shows a construction of a known memory device for such a parallel test, wherein 8-bit parallel data are processed for testing.

Referring to FIG. 1, each one of four pairs of data bus $DB_{0-3}$ is coupled to each output of eight data sensing/driving circuits 3 to 10 receiving each pair of data through each pair of input/output lines $IO_{0-7}$ from either one of two memory cell groups 1 and 2 Four transmission gates 11 to 14 are located at the center of the data bus pairs, for disconnecting or connecting the data bus pairs each coupled to a left group of the data sensing/driving circuits 3 to 6 and a right group of the data sensing/driving circuits 7 to 10. These transmission gates 11 to 14 are constructed with N-channel and P-channel MOS transistors having each gate coupled to receive either directly or through inverter 15, a parallel test enable signal $\phi_{PTE}$. To other end of the data bus pairs is coupled a data selection circuit 16 to which a data output buffer (not shown) is further connected. A pair of first comparators 17 and 19 have inputs coupled with each pair of the data bus and have each output to deliver a pair of data to a second comparator 18. A switching circuit 20 is connected between the second comparator 18 and the data output buffer and the data selection circuit 16. The first comparators 17 and 19, the data selection circuit 16, the second comparator 18 and the switching circuit 20 are in common controlled by the parallel test enable signal $\phi_{PTE}$, as in the transmission gates 11 to 14. According to this construction of 8-bit parallel test method, once eight pairs of data are provided through eight pairs of the input/output line from the two memory cell groups 1 and 2, the data are sensed and amplified and then driven by the data sensing and driving circuits 3 to 10, prior to transmission to the four data bus pairs, respectively. The eight pairs of transmitted data are, each in four pairs, provided to both first comparators 17 and 19 which respectively decode the received data into each pair of data to the second comparator 18. Then the second comparator turns the received two data pairs into a single pair of data, which data are delivered to the data output buffer through the switching circuit 20.

At this stage, as the parallel test enable signal $\phi_{PTE}$ is a logic high state designating a test mode, the transmission gates 11 to 14 coupling the right and left data bus pairs together upon a normal mode are all turned off, and the data selection circuit 16 also does not function. On the contrary, in a normal mode, as the signal $\phi_{PTE}$ is a logic low state, the first and second comparators 17, 19 and 18, and the switching circuit 20 do not function.

Therefore, in a normal mode, there is provided a data transmission path in a sequence of the memory cell groups 1 and 2—the data sensing and driving circuits 3 to 10—the data bus pairs—the data selection circuit 16—the data output buffer, and wherein the transmission gates 11 to 14 are, of course, turned on, whereas in a test mode, there is provided another data transmission path in sequence of the memory cell groups—the data sensing/driving circuit the data bus pairs—the first comparators 17 and 19—the second comparator 18—the switching circuit 20—the data output buffer, and wherein the transmission gates are turned off.

However, with the above described prior art construction, there arises a drawback of low operation speed, since the data selected from the left memory cell group must always pass through the transmission gates 11 to 14 to be transmitted to the data output buffer, during a normal mode. Moreover, in the prior art test method, since the data must be passed through a driver, which is located inside the data sensing/driving circuit 3 to 10, during a normal mode, the power consumption therein inevitably increases. In addition, existence of the transmission gates leads to an undesirable increase of the entire chip area in a high-integration memory device with a large number of data bus pairs.

OBJECT OF THE INVENTION

It is therefore an object of the present invention to provide an improved method capable of saving in power consumption and suitable for a large-scale integration in a multi-bit parallel test method for a semiconductor memory device.

Another object of the present invention is to provide a method of testing a plurality of parallel bits without affecting a normal operation of a semiconductor memory device.

To achieve the above objects and other advantages of the invention, in a preferred embodiment for performing a multi-bit parallel test in a semiconductor memory device with a data output buffer and a given number of data bus pairs and memory cell groups, the semiconductor memory device includes:

data sensing means for sensing each pair of data supplied from the memory cell groups;

driver means coupled between the data sensing means and the given number of data bus pairs;

first comparator means coupled between the data sensing means and a corresponding one of the data bus pairs, for receiving a group of data pairs supplied from the data sensing means and therefrom outputting a data pair on basis of the group of data pairs to the corresponding one of data bus pair;

second comparator means having inputs coupled to the data bus pairs and an output connectable to the data output buffer, for receiving a given number of data pairs from the data bus pairs and therefrom outputting one data pair; and data selection means having inputs coupled to the data bus pairs and an output coupled to the data output buffer, for receiving the given number of data pairs from the data bus pairs and therefrom outputting one data pair;

whereby the data sensing means delivers to the data bus pairs a plurality of data pairs from the memory cell group, through the driver means, upon a normal mode, whereas the data sensing means delivers the plurality of data pairs to the first comparator means, upon a test mode.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
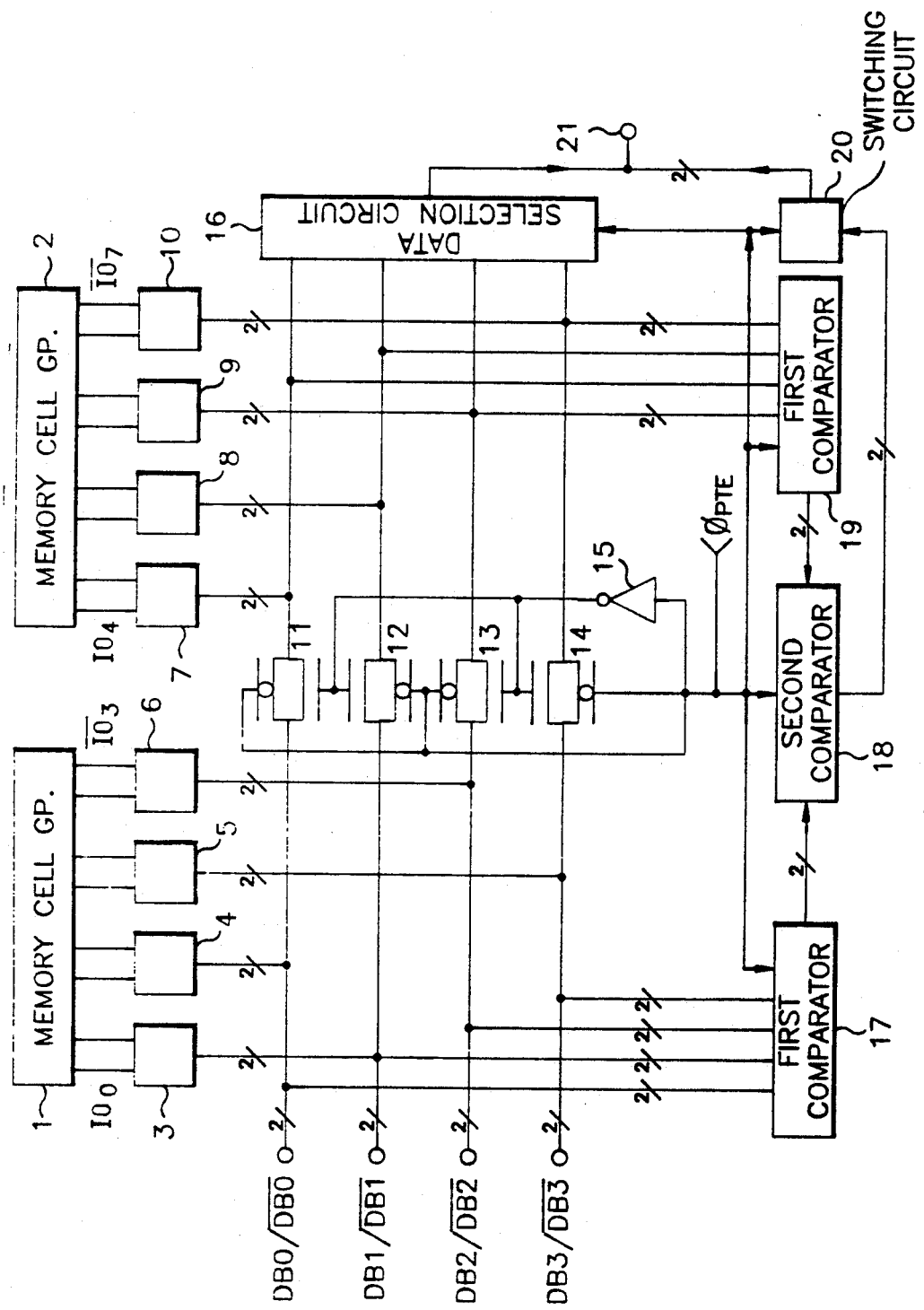
FIG. 1 shows a circuit arrangement for a parallel test according a prior art method.
Figure 2:
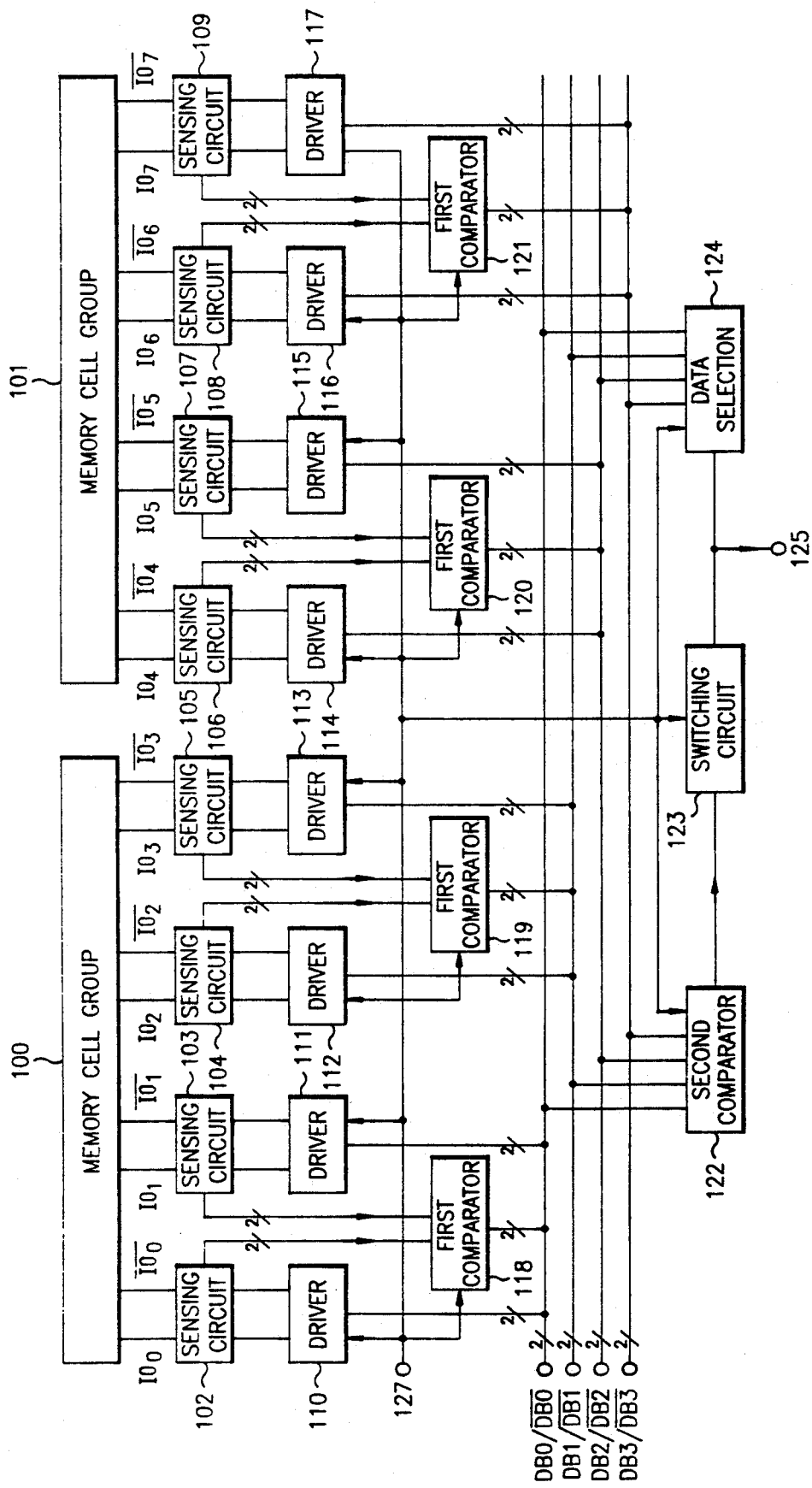
FIG. 2 shows a circuit arrangement for a multi-bit parallel test according to a preferred embodiment of the present invention.

Referring to FIG. 2, there is disclosed a circuit structure according to a multi-bit parallel test method of the present invention, in which embodiment 8-bit data are tested in parallel. As shown in the drawing, two memory cell groups 100 and 101 are respectively connected to each one of four data sensing circuits 102-105 and 106-109 in two groups, through each corresponding one of four input/output line pairs to $IO_0/\overline{IO_0}$ to $IO_3/\overline{IO_3}$ and $IO_4/\overline{IO_4}$ to $IO_7/\overline{IO_7}$. The data sensing circuits 102 to 109 are respectively coupled to drivers 110 to 117 and each pair of the adjacent data sensing circuits is coupled to first comparators 118 to 121, respectively. Each first comparator receives output of two data sensing circuits, that is, two pairs of data. Each data pair of outputs of the drivers 110 to 117 and the first comparators 118 to 121 is connected to either one of four data bus pairs $DB_0/\overline{DB_0}$ to $DB_3/\overline{DB_3}$, with two drivers and one first comparator per each data bus pair arrangement as illustrated. The four pairs of the data bus are all connected to a second comparator 122, which is subsequently connected to an input 125 of a data output buffer 125 (not shown) through a switching circuit 123. The four pairs of the data buses are further connected to a data selection circuit 124. The drivers 110 to 117, the first comparators 118 to 121, the second comparator 122, the switching circuit 123 and the data selection circuit 124 are in common controlled by a parallel test enable signal 127.

Figure 3:
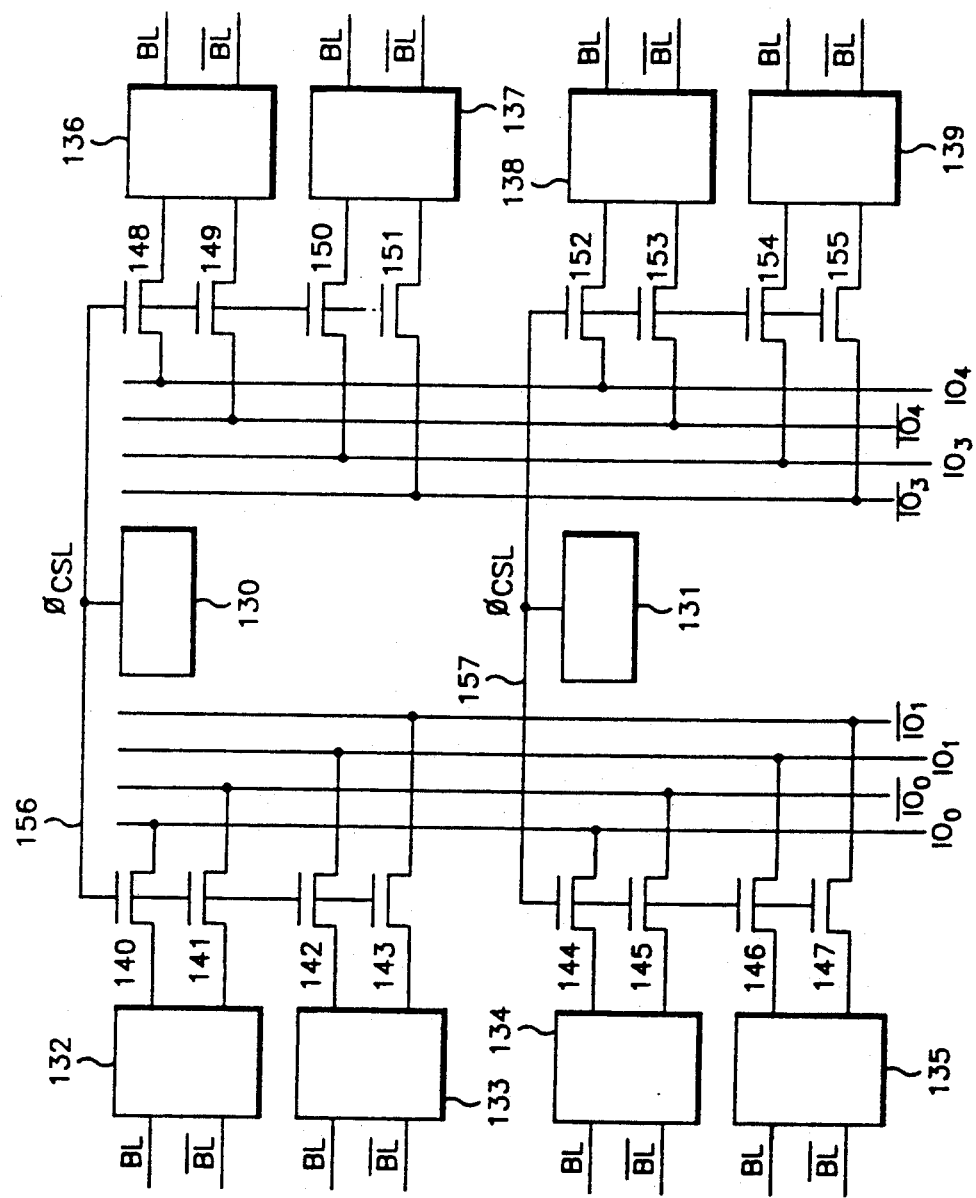
FIG. 3 shows an electrical circuit connection between memory cell blocks and input/output lines in accordance with FIG. 2.

FIG. 3 shows a preferred embodiment of connection between the left-sided memory cell group 100 and the input/output line pairs $IO_0/\overline{IO_0}$ to $IO_3/\overline{IO_3}$, wherein the input/output line pairs are connected to sense amplifiers 132 to 139 through transmission transistors 140 to 155. The sense amplifiers 132 to 139 are respectively connected to memory cells (not shown) through bit-line pairs $BL/\overline{BL}$. The transmission transistors 140 to 155 each transmit to the input/output line pairs $IO_0/\overline{IO_0}$ to $IO_3/\overline{IO_3}$, data supplied from the sense amplifiers in response to a column selection signal $\phi_{CSL}$ from column decoders 130 and 131, gates of the transmission transistors 140 to 155 being connected to either one of the column decoders 130 and 131 in each pair of four gates.

Figure 4:
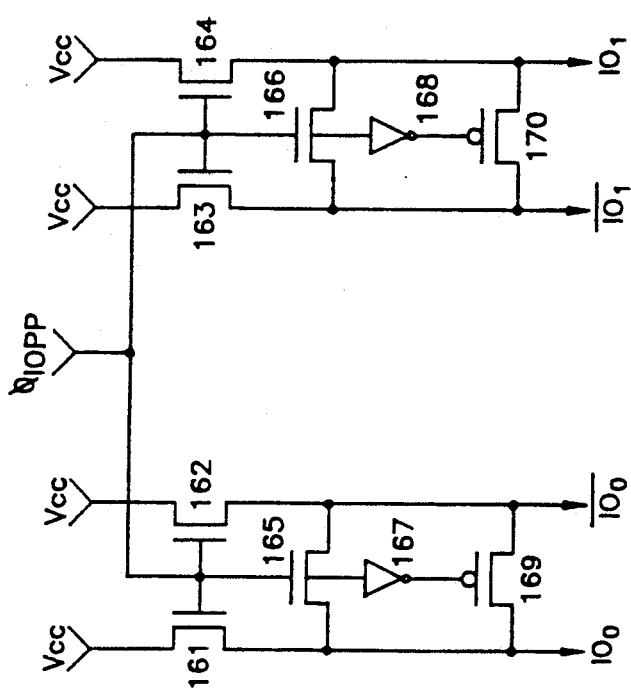
FIG. 4 shows a circuit diagram of an input/output line precharge circuit according to the present invention.

FIG. 4 shows a circuit for precharging and equalizing the input/output line pairs. This precharge and equalizing circuit for input/output lines includes precharge transistors 161 to 164 having each gate coupled to a precharge and equalizing signal $\phi_{IOPP}$, N-channel MOS transistors 165 and 166 and P-channel MOS transistors 169 and 170 for equalizing a pair of input/output lines, each gate of MOS transistors 165, 166 being coupled to receive the signal $\phi_{IOPP}$, and inverters 167 and 168 for inverting the signal $\phi_{IOPP}$ and applying the inverted signal to the gate of the P-channel MOS transistors 169 and 170. A precharge and equalization level on the input/output line pair in the circuit described heretofore, will become a voltage value reduced by a threshold voltage of the N-channel MOS transistor from a source voltage Vcc applied to drains of the precharge transistors 161 to 164.

Parallel Test Mode

Hereinafter, the operation of a multi-bit parallel test method according to the invention is described in further detail. Referring to FIG. 3, the data pair read out from a memory cell is transferred to sense amplifiers 132 to 139 through the bit line pair $BL/\overline{BL}$, and the data pair amplified in the sense amplifiers is transmitted to an input/output line pair through a turned-on transmission transistor when either one of both column decoders 130 and 131 produces a logic high state of column selection signal $\phi_{CSL}$. Before the data pair is transmitted to an input/output line pair by the logic high level of the column selection signal, the input/output line precharge and equalizing signal $\phi_{IOPP}$ shown in FIG. 4 maintains a logic high state during a given period and thereby, the input/output line pair remains in condition of being precharged and equalized into a value of $(Vcc-V_{TN})$, wherein Vcc is a source voltage and $V_{TN}$ is a threshold voltage of the N-channel MOS transistor. In addition, the parallel test enable signal 127 makes the drivers 110 to 117 and the data selection circuit 124 disable, while it makes the first comparators 118 to 121, the second comparators 122 and the switching circuit 123 enable. Therefore, the data pair transmitted into the input/output line pair is applied to the data sensing circuit 102 and 109, which circuit amplifies the data pair and then outputs to the first comparators 118 to 121 since the drivers 110 to 117 are disabled. The first comparators receive two data pairs and then deliver a selected data pair to data bus pairs $DB_0/\overline{DB_0}$ to $DB_3/\overline{DB_3}$, respectively. Thereafter, the second comparator 122 receives four data pairs from the first comparators 118 to 121 on the data bus pairs and transmits to the data output buffer 125, through the switching circuit 123, a data pair selected according to a decoding operation. That is, a transmission path of the data pairs in a parallel test mode corresponds to a sequence; memory cell groups 100 and 101—data sensing circuits 102 to 109—first comparators 118 to 121—data bus pairs—second comparator 122—switching circuit 123—data output circuit 125.

Normal Mode

In the meantime, upon a normal mode, the parallel test enable signal 127 makes disabled the first comparators 118 to 121, the second comparator 122 and the switching circuit 123. Hence, another transmission path to the data output buffer, different from the former transmission path of the data pair as in the parallel test mode described above, is formed in a sequence; the data sensing circuits 102 to 109—the drivers 110 to 117—the data bus pair—the data selection circuit.

In the aforementioned description of the preferred embodiment of the invention, a method of testing 8-bit parallel data has been disclosed by a way of example;

however, it would be understood to an ordinary person skilled in the art that for testing N-bit parallel data, a number of the first comparators will be a half (N/2) of the number N, each one of which comparators can process a quarter (N/4) of N-number of data pairs, and the second comparator can process a half (N/2) of N-number of data pairs from the first comparators.

As apparent from the above description, the invention provides a method capable of easily processing parallel data pairs by using only a given number of first and second comparators, upon testing a plurality of parallel bits in a semiconductor memory device; therefore the invention leads to saving in power and time consumed during testing. Moreover, the invention makes it possible to maintain a data bus at a constant state, either in a normal mode or in a test mode as well as to keep the data pairs from passing through any undesirable transmission path in the test mode, thereby achieving high-speed operation in both the test and normal modes.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. In a method for performing a multi-bit parallel test in a semiconductor memory device having a data output buffer and a given number of data bus pairs and memory cell groups,
    said semiconductor memory device comprising:
        data sensing means for sensing each pair of data supplied from said memory cell groups;
        first comparator means coupled between said data sensing means and a corresponding one of said data bus pairs, for receiving a group of data pairs supplied from said data sensing means and therefrom outputting data pair to said corresponding one of said data bus pair, and a basis of the group of data pairs;
        second comparator means having inputs coupled to said data bus pairs and an output connectable to the data output buffer, for receiving a given number of data pairs from said data bus pairs and therefrom outputting one data pair; and
        data selection means having inputs coupled to said data bus pairs and an output coupled to the data output buffer, for receiving said given number of data pairs from said data bus pairs and therefrom outputting one data pair;
        characterized in said data sensing means delivering to said data bus pairs a plurality of data pairs from said memory cell group, through said driver means, upon a first mode, and said data sensing means delivering said plurality of data pairs to said first comparator means, upon a second mode.

2. A method according to claim 1, wherein said first and second comparators are adapted to operate during only said second mode.

3. A method according to claim 1, wherein said first comparator means comprises a circuit for precharging an input stage to a given voltage level, whereby said circuit for precharging precharges input data in the first mode.

4. A method according to claim 1, further comprising switching means connectable to an output stage of said second comparator means, wherein said switching means is turned off during the first mode.

5. A method according to claim 1, wherein said first mode corresponds to a normal mode and said second mode corresponds to a test mode for a parallel data test in a semiconductor memory device.

6. A semiconductor memory device with a data output buffer and a given number of data bus pairs and memory cell groups, said semiconductor memory device comprising:
    data sensing means for sensing each pair of data supplied from said memory cell groups;
    driver means coupled between said data sensing means and said given number of data bus pairs;
    first comparator means coupled between said data sensing means and a corresponding one of said data bus pairs, for receiving a group of data pairs supplied from said data sensing means and therefrom outputting data pairs to said corresponding one of said data bus pairs, on a basis of the group of data pairs to said corresponding one of data bus pair;
    second comparator means having input ports coupled to said data bus pairs and an output port connectable to the data output buffer, for receiving a given number of data pairs from said data bus pairs and therefrom outputting one data pair; and
    data selection means having inputs coupled to said data bus pairs and an output coupled to the data output buffer, for receiving said given number of data pairs from said data bus pairs and therefrom outputting one data pair;
    whereby said data sensing means delivers to said data bus pairs a plurality of data pairs from said memory cell group, through said driver means, upon a first mode, whereas said data sensing means delivers said plurality of data pairs to said first comparator means, upon a second mode.

7. A semiconductor memory device according to claim 6, wherein said first and second comparators are adapted to operate during only said second mode.

8. A semiconductor memory device according to claim 6, wherein said first comparator means comprises a circuit for precharging an input stage to a given voltage level, whereby said circuit for precharging precharges input data in the first mode.

9. A semiconductor memory device according to claim 6, further comprising switching means connectable to an output stage of said second comparator means, wherein said switching means is turned off during the first mode.

10. A semiconductor memory device according to claim 6 wherein said first mode corresponds to a normal mode and said second mode corresponds to a test mode for a parallel data test in a semiconductor memory device.

11. A semiconductor device, comprising:
    a plurality of data bus pairs;
    a plurality of memory cell groups;
    means coupled to said memory cell groups, for sensing pairs of data bits;
    first comparator means coupled between said sensing means and said data bus pairs, for receiving a plurality of said pairs of data bits from said sensing means, and during a first mode, for transmitting data bit pairs to said plurality of data bus pairs;
    second comparator means coupled for providing during said first mode, a data bit pair in response to reception of said data bit pairs from said data bus pairs;

a plurality of drivers coupled between said sensing means and corresponding ones of said data bus pairs to receive said pairs of data bits from said sensing means and, during a second mode, to transmit said pairs of data bits to said data bus pairs; and data selection means coupled for providing during said second mode, a data bit pair in response to reception of said data bit pairs from said data bus pairs.

12. The semiconductor device of claim 11, further comprised of:

switching means coupled between said second comparator means and said output terminal, for transmitting said data bit pair provided by said second comparator means during said first mode; and an output terminal coupled to receive a data bit pair from said switching means and said data selection means.

13. The semiconductor device of claim 11, further comprised of:

a plurality of input/output leads conducting said pairs of data bits between said memory cell groups and said sensing means;

wherein said first comparator means includes means for precharging and equalizing potentials of said input/output leads during said first mode.

14. The semiconductor device of claim 12, further comprised of:

a plurality of input/output leads conducting said pairs of data bits between said memory cell groups and said sensing means;

wherein said first comparator means includes means for precharging and equalizing potentials of said input/output leads during said first mode.

15. The semiconductor device of claim 11, further comprised of said first comparator means including a plurality of first comparators equal in number to said plurality of data bus pairs.

16. The semiconductor device of claim 12, further comprised of said first comparator means including a plurality of first comparator stages equal in number to said plurality of data bus pairs.

17. The semiconductor device of claim 13, further comprised of said first comparator means including a plurality of first comparator stages equal in number to one-half of said plurality input/output leads.

18. The semiconductor device of claim 15, further comprised of said second comparator means including a plurality of second comparator stages equal in number to one-half of the number of said first comparator stages.

19. The semiconductor device of claim 16, further comprised of said second comparator means including a plurality of second comparator stages equal in number to one-half of the number of said first comparator stages.

20. The semiconductor device of claim 17, further comprised of said second comparator means including a plurality of second comparators equal in number to one-half of the number of said first comparators.

* * * * *

UNITED STATES PATENT AND TRADEMARK OFFICE
CERTIFICATE OF CORRECTION

PATENT NO. : 5,077,689
DATED : 31 December 1991
INVENTOR(S) : Gye-Ho AHN

It is certified that error appears in the above-indentified patent and that said Letters Patent is hereby corrected as shown below:

Column 1    Line 26,    After "2" insert "period" -- . --;

Column 2    Line  9,    After "circuit" insert "hyphen" -- - --:

Signed and Sealed this

Twentieth Day of June, 1995

Attest:

BRUCE LEHMAN

Attesting Officer    Commissioner of Patents and Trademarks